(12) United States Patent
Lee

(10) Patent No.: US 9,576,807 B2
(45) Date of Patent: Feb. 21, 2017

(54) WAFER POLISHING APPARATUS AND METHOD

(71) Applicant: LG SILTRON INCORPORATED, Gumi-si, Gyeongsangbuk-do (KR)

(72) Inventor: Jun Hee Lee, Gumi-si (KR)

(73) Assignee: LG SILTRON INCORPORATED, Seoul (KR)

( * ) Notice: Subject to any disclaimer, the term of this patent is extended or adjusted under 35 U.S.C. 154(b) by 0 days.

(21) Appl. No.: 14/765,043

(22) PCT Filed: Jul. 23, 2013

(86) PCT No.: PCT/KR2013/006584
§ 371 (c)(1),
(2) Date: Jul. 31, 2015

(87) PCT Pub. No.: WO2014/129708
PCT Pub. Date: Aug. 28, 2014

(65) Prior Publication Data
US 2015/0380255 A1 Dec. 31, 2015

(30) Foreign Application Priority Data
Feb. 25, 2013 (KR) ........................ 10-2013-0019710

(51) Int. Cl.
*B24B 37/00* (2012.01)
*H01L 21/304* (2006.01)
(Continued)

(52) U.S. Cl.
CPC ............ *H01L 21/304* (2013.01); *B24B 37/04* (2013.01); *B24B 37/08* (2013.01); *B24B 37/28* (2013.01)

(58) Field of Classification Search
CPC B24B 7/17; B24B 37/08; B24B 7/228; B24B 11/06; B24B 41/04
(Continued)

(56) References Cited

U.S. PATENT DOCUMENTS 6,280,304 B1 * 8/2001 Nakamura .............. B24B 37/08
451/261
6,648,735 B2 * 11/2003 Miyashita ............. B24B 37/042
451/261
(Continued)

FOREIGN PATENT DOCUMENTS

JP 2004-216492 8/2004
JP 2006-150507 A 6/2006
(Continued)

OTHER PUBLICATIONS

International Search Report and Written Opinion dated Dec. 16, 2013 issued in Application No. PCT/KR2013/006584.
(Continued)

*Primary Examiner* — George Nguyen
(74) *Attorney, Agent, or Firm* — KED & Associates, LLP

(57) ABSTRACT

Disclosed is a wafer processing apparatus. The wafer processing apparatus includes a first surface plate on which a plurality of carriers is arranged, a first gear arranged at the central region of the first surface plate and engaged with the plurality of carriers, a second gear arranged around the edge region of the first surface plate and engaged with the plurality of carriers, a motor rotating the first surface plate in a first direction, a fixing hanger arranged opposite the first surface plate, and a second surface plate hung on the fixing hanger such that a clearance between the first surface plate and the second surface plate may be varied.

20 Claims, 7 Drawing Sheets

(51) Int. Cl.
*B24B 37/08* (2012.01)
*B24B 37/28* (2012.01)
*B24B 37/04* (2012.01)

(58) Field of Classification Search
USPC .......................................................... 451/262
See application file for complete search history.

(56) References Cited

U.S. PATENT DOCUMENTS

| 2002/0102931 | A1* | 8/2002 | Ohkuma | .................... | B24B 7/17 |
| | | | | | 451/262 |
| 2009/0042487 | A1* | 2/2009 | Tokura | .................... | B24B 49/16 |
| | | | | | 451/41 |

FOREIGN PATENT DOCUMENTS

| JP | 2008-55577 | | 3/2008 |
| JP | 2010-221348 | A | 10/2010 |
| KR | 10-2005-0111947 | A | 11/2005 |
| KR | 10-2007-0000600 | A | 1/2007 |
| KR | 10-2009-0094061 | A | 9/2009 |
| KR | 10-2010-0099991 | A | 9/2010 |
| KR | 10-2010-0116354 | A | 11/2010 |

OTHER PUBLICATIONS

Korean Office Action dated Feb. 15, 2014 issued in Application No. 10-2013-0019710.
Korean Notice of Allowance dated Sep. 26, 2014 issued in Application No. 10-2013-0019710.
Japanese Office Action dated Aug. 19, 2016 issued in Application No. 2015-556863.

* cited by examiner

WAFER POLISHING APPARATUS AND METHOD

CROSS-REFERENCE TO RELATED PATENT APPLICATIONS

This application is a U.S. National Stage Application under 35 U.S.C. §371 of PCT Application No. PCT/KR2013/006584, filed Jul. 23, 2014, which claims priority to Korean Patent Application No. 10- 2013- 0019710, filed Feb. 25, 2013, whose entire disclosures are hereby incorporated by reference.

TECHNICAL FIELD

Embodiments relate to a processing apparatus of a wafer used as a material of a semiconductor device, and more particularly, to a silicon wafer polishing apparatus and method.

BACKGROUND ART

As a material of a semiconductor device, silicon (Si) wafers have been widely used. Silicon wafers are acquired by growing silicon on the surface of silicon of the same type. Such a silicon wafer has excellent purity and crystallinity of a semiconductor integrated region and is advantageous in terms of yield of a semiconductor device and improvement of device characteristics.

In general, a silicon wafer is formed through a single crystal growth process to form a single crystal ingot, a slicing process to acquire a thin circular wafer by slicing the single crystal ingot, a grinding process to grind the outer circumferential part of the wafer acquired by the slicing process so as to prevent the wafer from being cracked and distorted, a lapping process to eliminate damage due to mechanical processing of the wafer, a polishing process to smooth the surface of the wafer, and a washing process to remove abrasives or particles from the wafer.

The process of polishing the surface of the wafer to eliminate damage generated in the preceding processes is necessary. A double sided polishing process of surfaces of the wafer is carried out by frictional force generated by relative movement between polishing pads attached to an upper surface plate and a lower surface plate and the wafer and the reaction of slurry containing polishing abrasives and various additives.

FIG. 1 is a view of a conventional wafer processing apparatus.

As shown in FIG. 1, the wafer processing apparatus includes a first pad 120 and a second pad 150 provided between a lower surface plate, i.e., a first surface plate 110, and an upper surface plate, i.e., a second surface plate 140. Carriers (not shown) into which wafers are inserted are placed between the respective pads 120 and 150, and are thus rotated between a first gear 170 and a second gear 180.

When slurry is injected under the condition that the carriers are placed between the first surface plate 110 and the second surface plate 140, both surfaces of the wafers within the carriers are polished through mechanical/chemical polishing.

The first surface plate 110 is rotated about a first rotary shaft 130 by a first motor 135, and the second surface plate 140 is rotated about a second rotary shaft 160 by a second motor 165. The first surface plate 110 and the second surface plate 140 are rotated in different directions, thus facilitating mechanical polishing of a surface of the wafer.

However, the conventional wafer processing apparatus has problems, as follows.

As the wafers are polished by rotation of the first pad and the second pad during the above-described process, the first pad and the second pad are worn. Here, the first pad and the second pad are not uniformly worn, but may be locally worn.

Further, the upper surface plate and the lower surface plate may be thermally expanded during polishing of a surface of the wafer. Here, a large amount of heat is generated from regions of the first pad and the second pad contacting the wafers, and thus the corresponding parts of the upper surface plate and the lower surface plate may be greatly thermally expanded.

FIG. 2 is a cross-sectional view of the first pad and the second pad of FIG. 1.

The parts of the upper surface plate and the lower surface plate corresponding to the regions of the first pad 120 and the second pad 150 contacting the wafers are thermally expanded, and the thickness of these regions of the first pad 120 and the second pad 150 contacting the wafers may be greater than other regions of the first pad 120 and the second pad 150, as shown in FIG. 2. Such local abrasion of the first pad 120 and the second pad 150 may cause non-uniform polishing surfaces of the wafers.

Further, when the upper surface plate and the lower surface plate are rotated about different rotary shafts, balance between the upper surface plate and the lower surface plate may be difficult, and when the upper surface plate and the lower surface plate are independently rotated under the condition that the first pad and the second pad is not uniformly worn, the upper surface plate and the lower surface plate are rotated so as not to be parallel with each other, thus causing severe non-uniform polishing surfaces of the wafers.

DISCLOSURE

Technical Problem

Embodiments provide a wafer processing apparatus and method which uniformly processes the whole surfaces of wafers during polishing of surfaces of the wafers.

Technical Solution

In one embodiment, a wafer processing apparatus includes a first surface plate on which a plurality of carriers is arranged, a first gear arranged at the central region of the first surface plate and engaged with the plurality of carriers, a second gear arranged around the edge region of the first surface plate and engaged with the plurality of carriers, a motor rotating the first surface plate in a first direction, a fixing hanger arranged opposite the first surface plate, and a second surface plate hung on the fixing hanger such that a clearance between the first surface plate and the second surface plate may be varied.

The second surface plate may be arranged opposite the first surface plate.

The wafer processing apparatus may further include a first pulley unit arranged on the second surface plate and a second pulley unit arranged on the fixing hanger.

The wafer processing apparatus may further include a cable guided by the first pulley unit and the second pulley unit.

Each of the first pulley unit and the second pulley unit may include a plurality of pulleys, and the number of the plurality of pulleys of the first pulley unit may be equal to the number of the plurality of pulleys of the second pulley unit.

The plurality of pulleys of the first pulley unit and the plurality of pulleys of the second pulley unit may be alternately arranged.

The plurality of pulleys of the second pulley unit may protrude from the edge of the fixing hanger.

The contour of a circumference connecting the plurality of pulleys of the first pulley unit may be equal to the contour of a circumference connecting the plurality of pulleys of the second pulley unit.

The wafer processing apparatus may further include at least two protrusions arranged at a region of the second surface plate opposite the fixing hanger, and support members respectively coupled with the at least two protrusions and obstructing movement of the second surface plate in a second direction.

The second direction may be parallel with the first direction.

The at least two protrusions may be opposite each other across the central region of the second surface plate.

Each of the support members may include a body extending from the outer portion of the second surface plate, and at least one support unit combined with the body and surrounding each of the at least two protrusions.

The body of each of the support members may contact one side surface of each of the at least two protrusions and be arranged in the same rotating direction with respect to each of the at least two protrusions.

A plurality of through holes may be formed through the second surface plate such that density of the plurality of through holes arranged at the central region of the second surface plate is higher than density of the plurality of through holes arranged at the edge region of the second surface plate.

The wafer processing apparatus may further include a first pad arranged on the first surface plate between the first gear and the second gear.

The wafer processing apparatus may further include a second pad arranged on the second surface plate opposite the first pad, and the contour of a surface of the second pad opposite one surface of the first pad may be reverse to the contour of the surface of the first pad.

In another embodiment, a wafer processing method includes arranging a plurality of carriers, each of which includes a plurality of wafers, between a first gear located at the central region of a first surface plate and a second gear located around the edge region of the first surface plate such that the plurality of carriers is engaged with the first gear and the second gear, arranging a second surface plate on the first surface plate so as to be opposite the first surface plate, and rotating the first surface plate in a first direction, wherein the second surface plate is configured such that a clearance between the first surface plate and the second surface plate may be varied.

The second surface plate may be fixed in the first direction.

In yet another embodiment, a wafer processing apparatus includes a first surface plate on which a plurality of carriers is arranged, a first gear arranged at the central region of the first surface plate and engaged with the plurality of carriers, a second gear arranged around the edge region of the first surface plate and engaged with the plurality of carriers, a motor rotating the first surface plate in a first direction, a second surface plate arranged opposite the first surface plate and provided with a first pulley unit arranged on the second surface plate, and a fixing hanger arranged opposite the first surface plate across the second surface plate and provided with a second pulley unit arranged on the fixing hanger and guided by a cable together with the first pulley unit.

The wafer processing apparatus may further include at least two protrusions arranged at a region of the second surface plate opposite the fixing hanger, and support members respectively coupled with the at least two protrusions and obstructing movement of the second surface plate in a second direction.

Advantageous Effects

In a wafer processing apparatus and method in accordance with one embodiment, since the wafer processing apparatus is operated under the condition that the second surface plate is mounted on a first surface plate, the shape of a second pad may be deformed according to the shape of a first pad, and equal pressure may be applied to all regions of wafers arranged between the first pad and the second pad so as to process the wafers flatly.

Further, DIW may cool heat generated from the first/second surface plates and the first/second pads during a process, such as the wafer polishing process, and remove particles generated during processing and scraps of the pads.

Particularly, since a larger number of through holes is formed at the central regions of the second surface plate and the second pad than the edge regions of the second surface plate and the second pad, a larger amount of DIW may be supplied to the central regions of the second surface plate and the second pad through and, since DIW flows in the outward direction by centrifugal force, the wafers may be uniformly processed in all regions of the first surface plate and the second surface plate.

The effects of the present invention are not limited to the above-described effects and other effects which are not described herein will become apparent to those skilled in the art from the following description.

DESCRIPTION OF DRAWINGS

The accompanying drawings, which are included to provide a further understanding of the invention and are incorporated in and constitute a part of this application, illustrate embodiment(s) of the invention and together with the description serve to explain the principle of the invention. In the drawings.

BEST MODE

Figure 1:
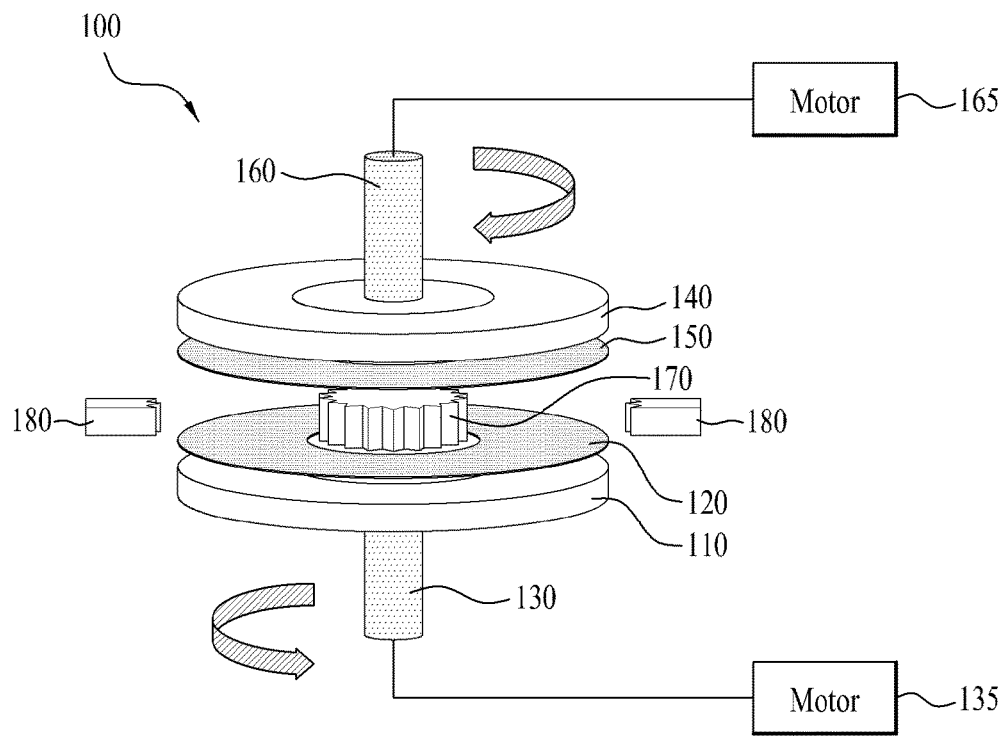
FIG. 1 is a view of a conventional wafer processing apparatus.
Figure 2:
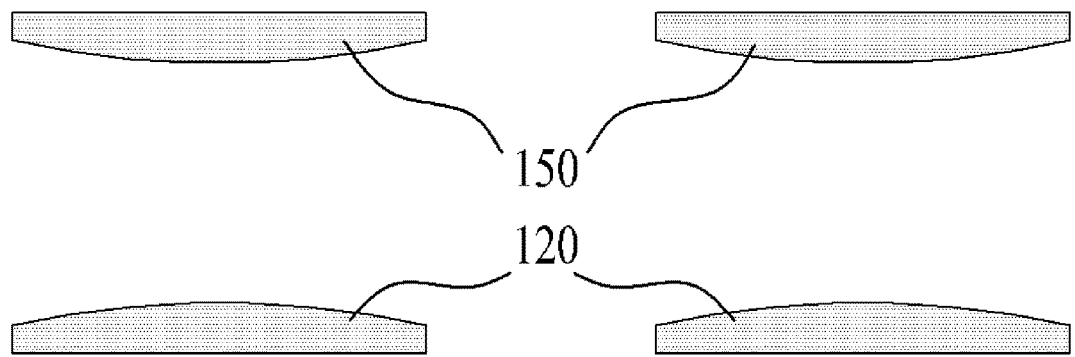
FIG. 2 is a cross-sectional view of a first pad and a second pad of FIG. 1.

Hereinafter, embodiments will be described with reference to the annexed drawings. Some parts in the embodiments which are substantially the same as those in the conventional wafer processing apparatus are denoted by the same reference numerals even though they are depicted in different drawings, and a detailed description thereof will be omitted because it is considered to be unnecessary.

Figure 3:
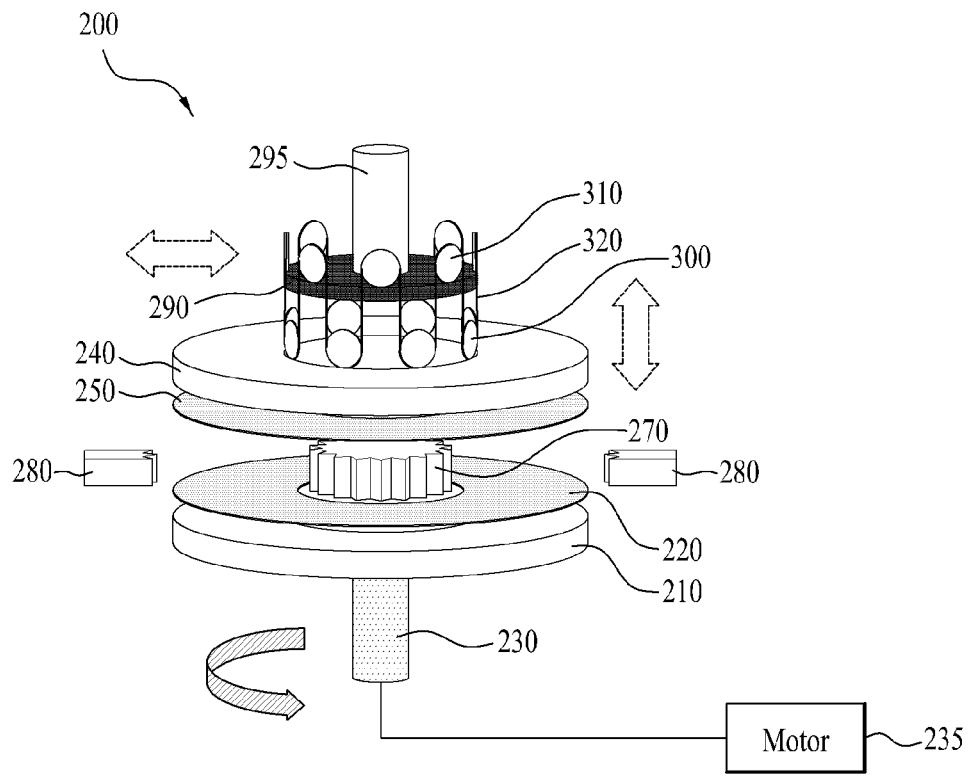
FIG. 3 is a view illustrating a wafer processing apparatus in accordance with one embodiment.

FIG. 3 is a view illustrating a wafer processing apparatus in accordance with one embodiment.

The wafer processing apparatus 200 in accordance with this embodiment includes a first surface plate 210, a first pad 220, a first rotary shaft 230, a first motor 235, a first gear 270, a second gear 280, a second surface plate 240, a second pad 250, a fixing hanger 290, a fixing shaft 295, a first pulley unit 300, a second pulley unit 310, and a cable 320.

The wafer processing apparatus 200 may be used in a wafer polishing, lapping or grinding process. Carriers 400 shown in FIG. 4 may be arranged on a lower surface plate, i.e., the first surface plate 210, the first gear 270 is arranged at the central region of the first surface plate 210, and the second gear 280 is arranged around the edge region of the first surface plate 210.

Figure 4:
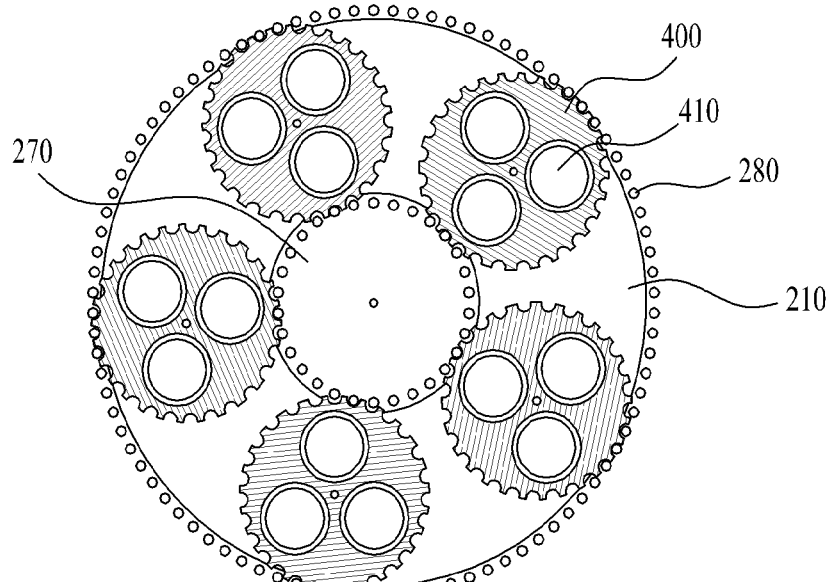
FIG. 4 is a view illustrating the actions of a first gear, a second gear and carriers of FIG. 3.

FIG. 4 is a view illustrating the actions of the first gear, the second gear and the carriers of FIG. 3.

Plural wafers 410 may be inserted into each of the carriers 400, and plural carriers 400 may be arranged on the first surface plate 210 between the first gear 270 and the second gear 280 such that the plural carriers 400 are engaged with the first gear 270 and the second gear 280.

The carriers 400 are rotated and revolved on the first surface plate 210 according to rotation of the first gear 270 and the second gear 280. At this time, the wafers 410 within the respective carriers 400 are rotated and revolved and may thus be polished by the first pad 220 and the second pad 250. The first pad 220 and the second pad 250 may be formed of diamond, silicon carbide (SiC) and cerium dioxide ($CeO_2$), or formed of polyurethane or a polymer resin.

In this embodiment, the first surface plate 210 is rotated about the first rotary shaft 230 in a first direction (shown by arrow in FIG. 3) by power received from the first motor 235. The first surface plate 210 is rotated together with the first gear 270 and the second gear 280, but the second surface plate 240 is not rotated.

The fixing hanger 290 is fixed to the fixing shaft 295 and is arranged so as to be opposite the first surface plate 210 across the second surface plate 240. The radius of the fixing hanger 290 may be smaller than the radius of the second surface plate 240 because the second pulley unit 310 may be connected to the first pulley unit 300 on the second surface plate 240, as described later.

The second surface plate 240 may be hung on the fixing hanger 290 so as to be opposite the first surface plate 210. By the actions of the first pulley unit 300, the second pulley unit 310 and the cable 320, the second surface plate 240 may be hung on the fixing hanger 290 and thus a clearance between the second surface plate 240 and the first surface plate 210 may be varied. With reference to FIG. 3, the second surface plate 240 may be moved within a designated range in the direction of the arrow opposite the first surface plate 210.

Figure 5:
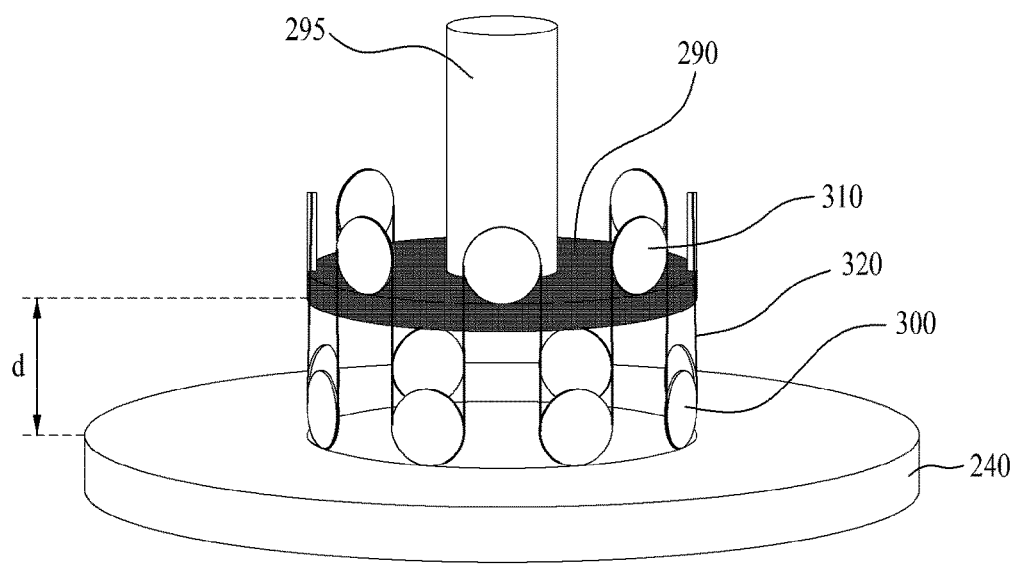
FIG. 5 is a view illustrating the action of a fixing hanger of FIG. 3.

FIG. 5 is a view illustrating the action of the fixing hanger of FIG. 3.

The first pulley unit 300 is arranged on the second surface plate 240 and may include a plurality of pulleys. Further, the second pulley unit 310 is arranged on the fixing hanger 290 and may include a plurality of pulleys.

The respective pulleys of the second pulley unit 310 are arranged at the outer region of the edge of the fixing hanger 290 and may be connected to the pulleys of the first pulley unit 210 through the cable 320. That is, since the plural pulleys of the second pulley unit 310 are protruded from the edge of the fixing hanger 290, the cable 320 may be connected to the first pulley unit 320 without contact with the fixing hanger 290.

A wire, etc. may be used as the cable 320. Since the first pulley unit 300 and the second pulley unit 310 are connected by one cable 320, the first pulley unit 300 on the second surface plate 240 may be hung on the second pulley unit 310 on the fixing hanger 290.

In FIG. 5, a distance between the upper surface of the second surface plate 240 and the lower surface of the fixing hanger 290 may be varied by vertical movement of the second surface plate 240, as described later.

The plural pulleys of the first pulley unit 300 and the plural pulleys of the second pulley unit 310 may be prepared in the same number. Further, the plural pulleys of the first pulley unit 300 and the plural pulleys of the second pulley unit 310 may be alternately arranged, and be guided by the cable 320.

The contour of a circumference connecting the plural pulleys of the first pulley unit 300 may be equal to the contour of a circumference connecting the plural pulleys of the second pulley unit 310. The reason for this is that the plural pulleys of the first pulley unit 300 and the plural pulleys of the second pulley unit 310 may be guided by one cable 320.

Figure 6:
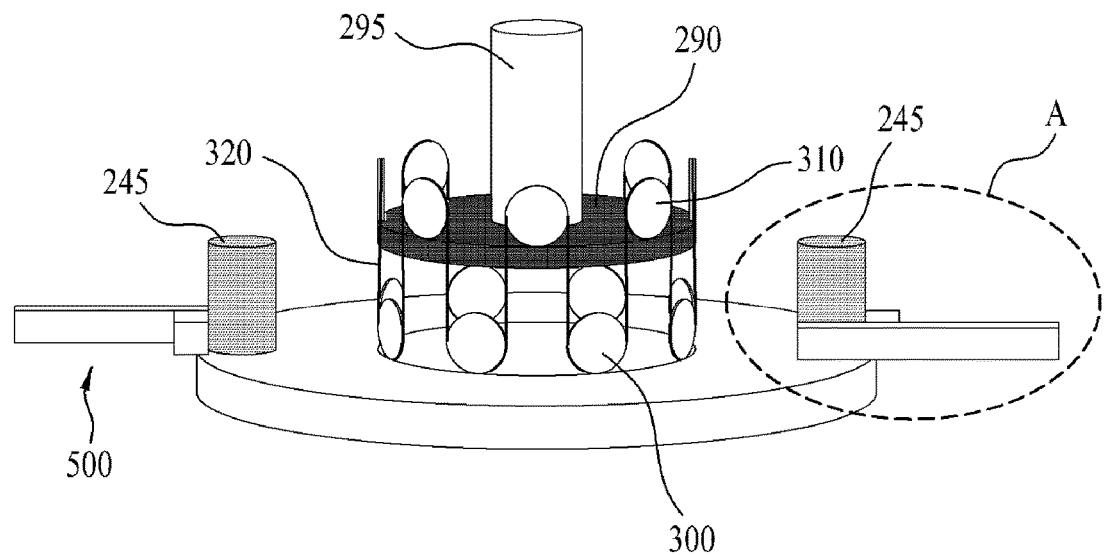
FIG. 6 is a view illustrating a wafer processing apparatus in accordance with another embodiment.

FIG. 6 is a view illustrating a wafer processing apparatus in accordance with another embodiment. In FIG. 6, only a region above a second surface plate 240 is illustrated.

The wafer processing apparatus in accordance with this embodiment is the same as the wafer processing apparatus shown in FIG. 4 except that the wafer processing apparatus in accordance with this embodiment further includes protrusions 245 and support members 500.

The protrusions 245 may be formed in a region on the second surface plate 240 opposite the fixing hanger 290. At least two protrusions 245 may be formed. The two protrusions 245 may be arranged opposite each other across the central region of the second surface plate 240.

The support members 500 may be coupled with the protrusions 245 and obstruct movement of the second surface plate 240 in a second direction. Here, the second direction is the horizontal direction of FIG. 6, and is parallel with the above-described first direction which is the rotating direction of the first surface plate 210.

The second surface plate 240 and the fixing hanger 290 may move in the vertical direction of FIG. 6 through the cable 320 connected to the first pulley unit 300 and the second pulley unit 310. However, movement of the second surface plate 240 and the fixing hanger 290 in the first direction, i.e., the horizontal direction, is prevented by coupling the support members 500 with the protrusions 245.

Figure 7A:
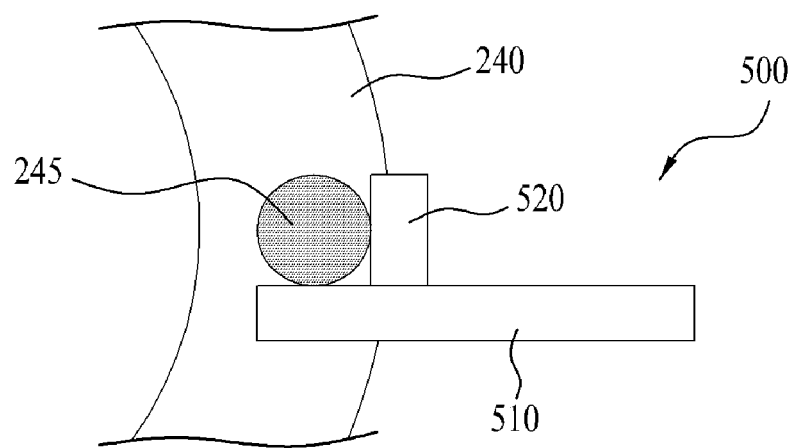
FIGS. 7a to 7c are views illustrating support members of FIG. 6 in accordance with embodiments.
Figure 7B:
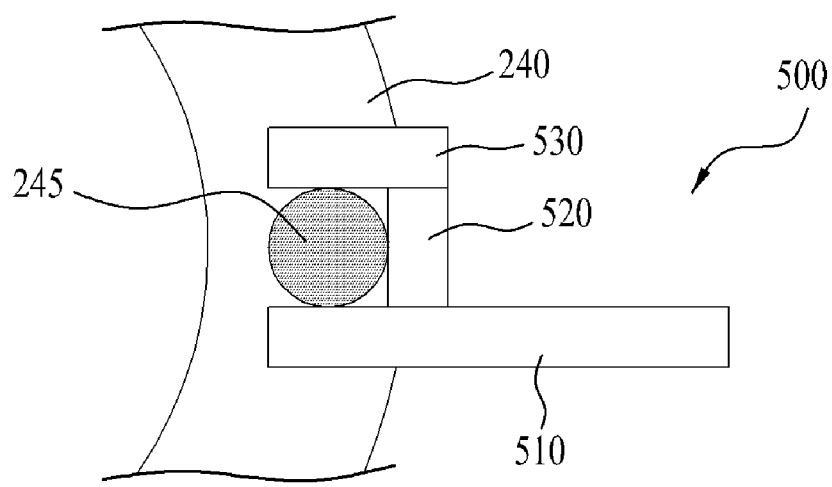
Figure 7C:
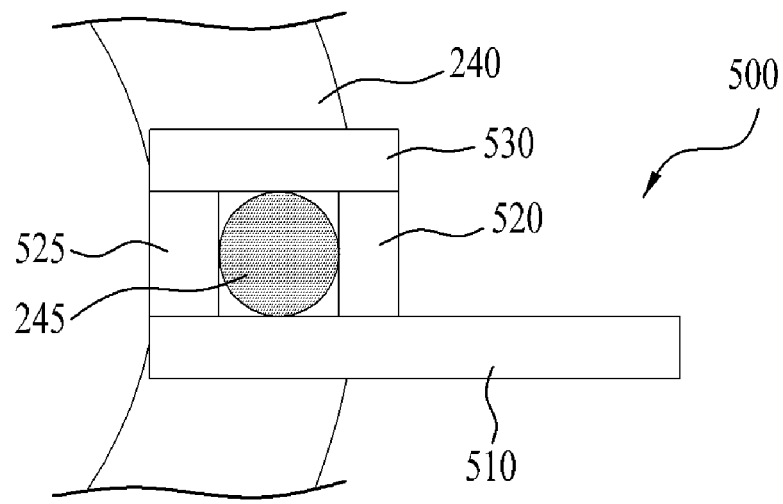

FIGS. 7a to 7c are views illustrating support members of FIG. 6 in accordance with various embodiments.

FIGS. 7a to 7c are plan views of an edge region of FIG. 6.

In FIG. 7a, protrusions 245 are arranged on the second surface plate 240, support members 500 contact the protrusions 245 in two directions. Each of the support members 500 may include a body 510 and a first support unit 520 connected to the body 510.

In FIG. 7b, protrusions 245 are arranged on the second surface plate 240, and support members 500 contact the protrusions 245 in three directions. Each of the support members 500 may include a body 510, and a first support unit 520 and a second support unit 530 connected to the body 510.

The second support unit 530 may be arranged opposite the body 510 and the first support unit 520 may connect the second support unit 530 to the body 510.

In FIG. 7c, protrusions 245 are arranged on the second surface plate 240, support members 500 contact the protrusions 245 in four directions. Each of the support members 500 may include a body 510, and a first support unit 520, a second support unit 530 and a third support unit 525 connected to the body 510.

The second support unit 530 may be arranged opposite the body 510, and the first support unit 520 may be arranged opposite the third support unit 525.

As shown in FIGS. 7a to 7c, the body 510, the first support unit 520, the second support unit 530 and the third support unit 525 forming the support member 500 are arranged so as to surround the protrusion 245 on the second surface plate 240, and may thus prevent the protrusion 245 and/or the second surface plate 240 from being rotated in the clockwise direction.

In the embodiments shown in FIGS. 7b and 7c, the support members 500 may prevent the protrusions 245 from being rotated in both the clockwise direction and the counterclockwise direction.

In the embodiment shown in FIG. 7a, the support members 500 may prevent the protrusions 245 from being rotated in the clockwise direction, and thus, the first surface plate 210 may be rotated such that rotating force in the clockwise direction is applied to the second surface plate 240. That is, the bodies 510 forming the support members 500 may be arranged with respect to the protrusions 245 in the same direction as the rotating direction of the first surface plate 210 and/or the second surface plate 240.

Figure 8A:
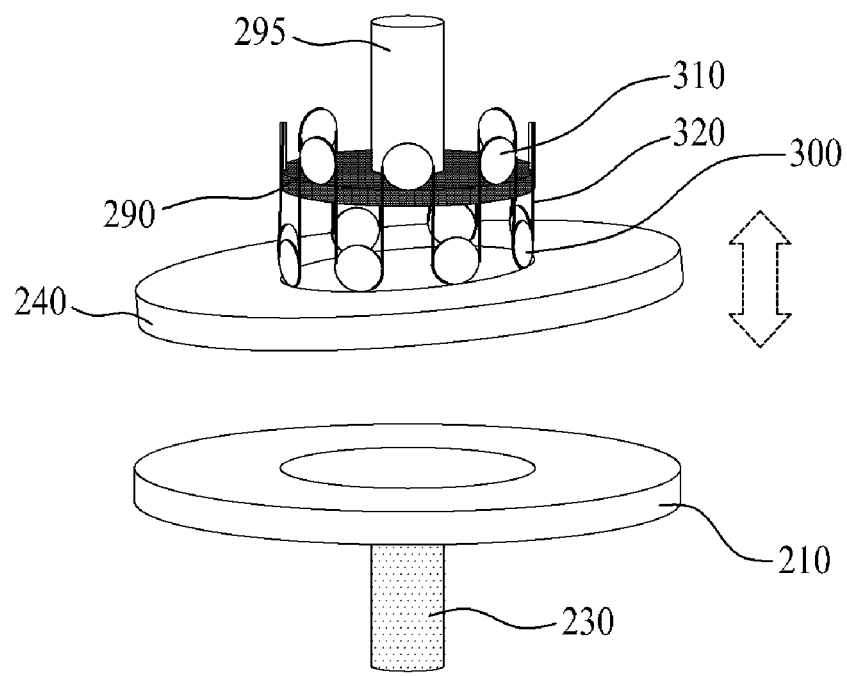
FIGS. 8a and 8b are views illustrating movement of a second surface plate during processing of wafers.
Figure 8B:
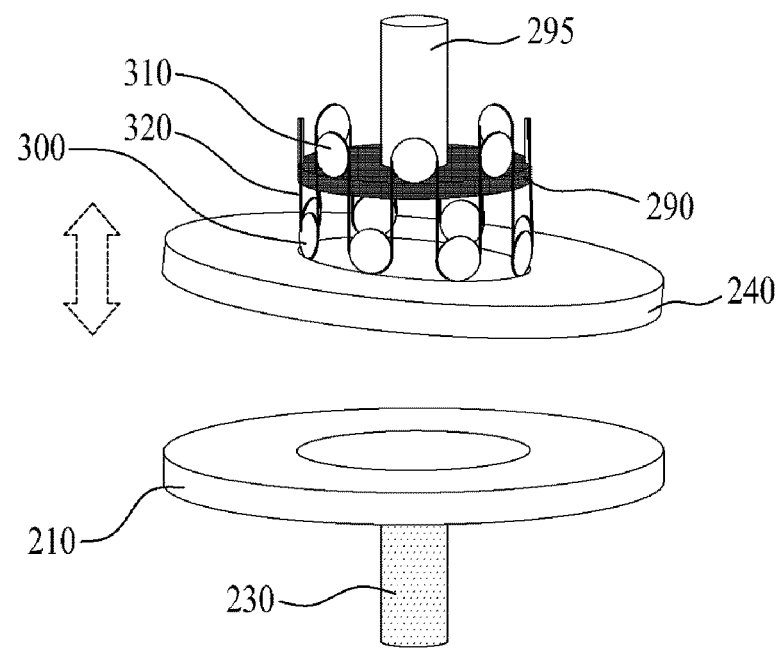

FIGS. 8a and 8b are views illustrating movement of the second surface plate during wafer processing.

A part of the first surface plate 210 may be expanded during the polishing process. At this time, the second surface plate 240 may be inclined in the upward and downward directions according to the uneven surface of the first surface plate 210. Here, force is applied to the second surface plate 240 by friction between the second surface plate 240 or the second pad 250 and the first surface plate 210 or the first pad 220, but the second surface plate 240 may not be rotated in the horizontal direction by the above-described action of the protrusions and the support members.

When the first surface plate 210 or the first pad 220 is locally worn and thus flatness thereof is varied, processing of wafers is carried out under the condition that the second surface plate 240 or the second pad 250 is not rotated but freely moves in the upward and downward directions.

Therefore, when flatness of the first pad 220 is varied, flatness of the second pad 250 is varied according to flatness of the first pad 220.

Figure 9:
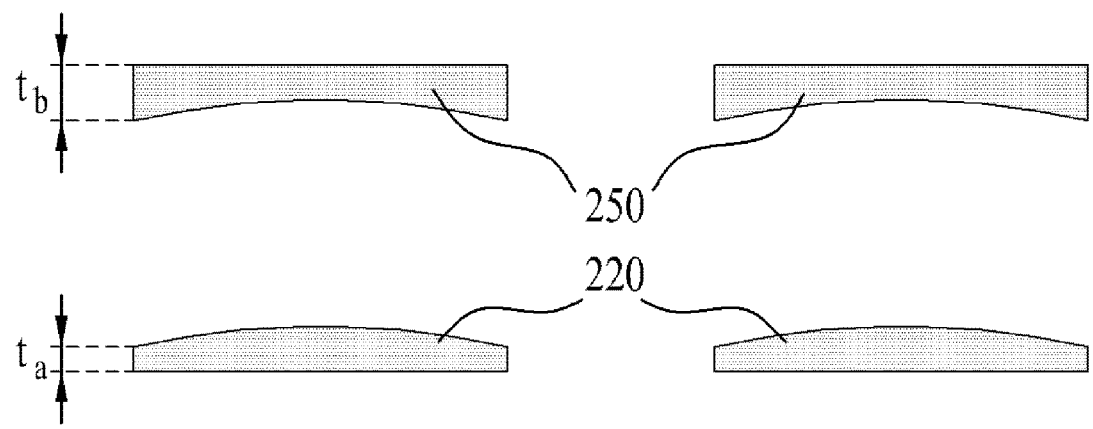
FIG. 9 is a view illustrating shapes of a first pad and a second pad after processing of wafers.
Figure 10:
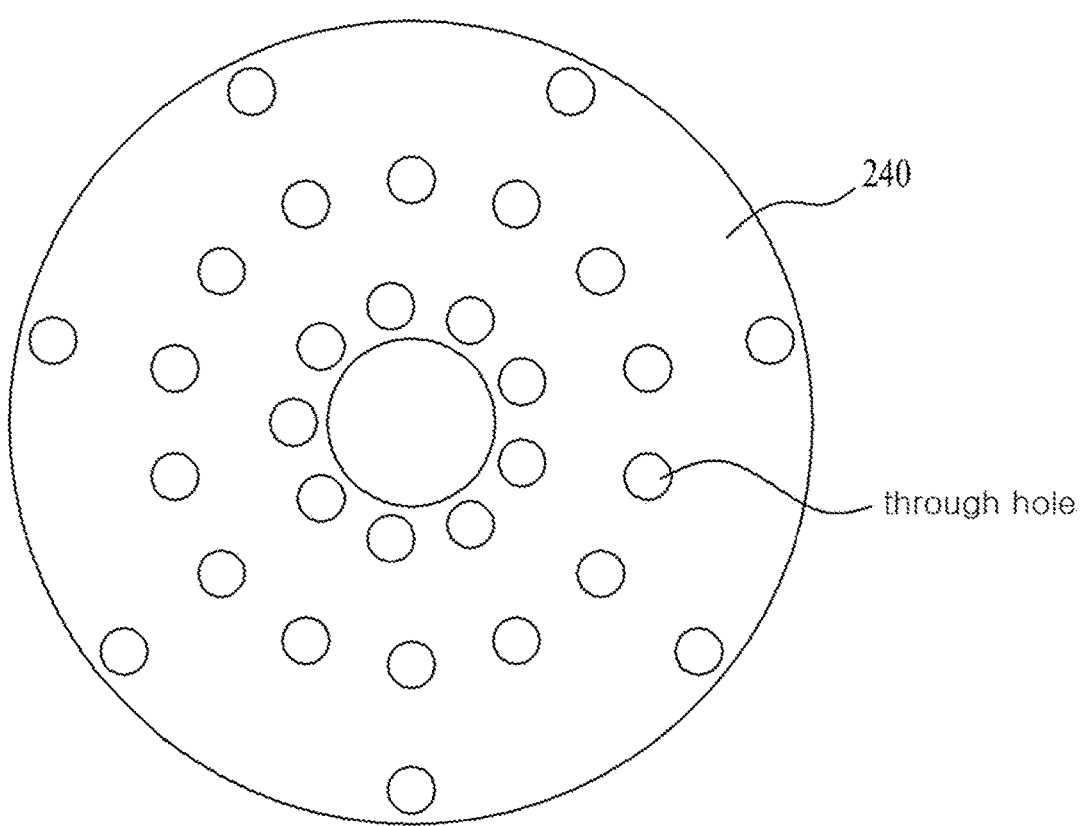
FIG. 10 is a view illustrating a plurality of through holes in a second surface plate according to an embodiment.

FIG. 9 is a view illustrating shapes of the first pad and the second pad after processing of wafers.

Since the wafer processing apparatus is operated under the condition that the second surface plate is mounted on the first surface plate, the shape of the second pad 250 may be deformed according to the shape of the first pad 220.

Therefore, as shown in FIG. 9, the shape of the second pad 250 corresponds to the shape of the first pad 220, and thus, equal pressure is applied to all regions of the wafers arranged between the first pad 220 and the second pad 250 and the wafers may be flatly processed.

In FIG. 9, when the first surface plate 210 is thermally expanded, a region of the first pad 220 closely contacting wafers receives more heat and undergoes greater thermal expansion. Therefore, a region of the first pad 220 between the first gear and the second gear may be deformed so as to have a greater thickness than the thickness of regions of the first pad 220 adjacent to the first gear and the second gear.

The contour of the surface of the second pad 250 opposite one surface of the first pad 220 may be reverse to the contour of the surface of the first pad 220, and thus, a region of the second pad 250 between the first gear and the second gear may be deformed so as to have a smaller thickness than the thickness of regions of the second pad 250 adjacent to the first gear and the second gear.

The wafer processing apparatus in accordance with this embodiment does not use slurry, a dispersant and an acid/alkali-based liquid, but may use deionized water (DIW) alone. DIW may cool heat generated from the first/second surface plates and the first/second pads during a process, such as the wafer polishing process, and remove sediment generated during processing and scraps of the pads.

DIW may be supplied to the carriers in which wafers are arranged via through holes formed on the second surface plate and the second pad during the process, such as the wafer polishing process. Here, the through holes formed on the second surface plate and the second pad may be arranged such that density of the through holes at the central region is higher than density of the through holes at the edge region.

A larger amount of DIW may be supplied to the central regions of the second surface plate and the second pad through such arrangement of the through holes, and, since DIW flows in the outward direction by centrifugal force, the wafers may be uniformly processed in all regions of the first surface plate and the second surface plate.

In case of the conventional second surface plate, DIW is uniformly supplied to all regions of the conventional second surface plate via through holes and flows in the outward direction by centrifugal force, and thus, wafers arranged at the edge regions of the conventional first and second surface plates may be more greatly processed.

Hereinafter, a wafer processing method using a wafer processing apparatus in accordance with one embodiment will be described.

Plural carriers, each of which includes plural wafers, are arranged between the first gear located at the central region of the first surface plate and the second gear located around the edge region of the first surface plate such that the carriers are engaged with the first gear and the second gear.

Thereafter, the second surface plate is arranged above the first surface plate so as to be opposite the first surface plate, and the first pad and the second pad are arranged on the first surface plate and the second surface plate.

The second surface plate may be hung on the fixing hanger such that a clearance between the second surface plate and the first surface plate may be varied, and be fixed by the support members so as not to be rotated in the first direction, i.e., the horizontal direction.

Thereafter, the first surface plate is rotated in the first direction. At this time, the second surface plate is movable in the vertical direction such that the clearance between the second surface plate and the first surface plate may be varied, but is fixed in the horizontal direction.

Here, since the wafer processing apparatus is operated under the condition that the second surface plate is mounted on the first surface plate, the shape of the second pad may be deformed according to the shape of the first pad, and equal pressure may be applied to all regions of wafers arranged between the first pad and the second pad so as to process the wafers flatly.

Further, DIW may cool heat generated from the first/second surface plates and the first/second pads during, for example, the wafer polishing process, and remove sediment generated during processing and scraps of the pads. Particularly, since a larger number of through holes is formed at the central regions of the second surface plate and the second pad than the edge regions of the second surface plate and the second pad, a larger amount of DIW may be supplied to the central regions of the second surface plate and the second pad and, and since DIW flows in the outward direction by centrifugal force, the wafers may be uniformly processed in all regions of the first surface plate and the second surface plate.

MODE FOR INVENTION

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. A wafer processing apparatus comprising:
a first surface plate on which a plurality of carriers is arranged;
a first gear arranged at the central region of the first surface plate and engaged with the plurality of carriers;
a second gear arranged around the edge region of the first surface plate and engaged with the plurality of carriers;
a motor that rotates the first surface plate in a first direction;
a fixing hanger arranged opposite the first surface plate;
a second surface plate hung on the fixing hanger such that a clearance between the first surface plate and the second surface plate may be varied;
at least two protrusions arranged at a region of the second surface plate opposite the fixing hanger; and
support members respectively coupled with the at least two protrusions and obstructing movement of the second surface plate in a second direction,
wherein each of the support members includes a body that extends from the outer portion of the second surface plate, and at least one support system combined with the body and surrounding each of the at least two protrusions.

2. The wafer processing apparatus according to claim 1, wherein the second surface plate is arranged opposite the first surface plate.

3. The wafer processing apparatus according to claim 1, further comprising:
a first pulley system arranged on the second surface plate; and
a second pulley system arranged on the fixing hanger.

4. The wafer processing apparatus according to claim 3, further comprising a cable guided by the first pulley system and the second pulley system.

5. The wafer processing apparatus according to claim 4, wherein each of the first pulley system and the second pulley system includes a plurality of pulleys, and the number of the plurality of pulleys of the first pulley system is equal to the number of the plurality of pulleys of the second pulley system.

6. The wafer processing apparatus according to claim 5, wherein the plurality of pulleys of the first pulley system and the plurality of pulleys of the second pulley system are alternately arranged.

7. The wafer processing apparatus according to claim 4, wherein the plurality of pulleys of the second pulley system protrudes from the edge of the fixing hanger.

8. The wafer processing apparatus according to claim 7, wherein the contour of a circumference connecting the plurality of pulleys of the first pulley system is equal to the contour of a circumference connecting the plurality of pulleys of the second pulley system.

9. The wafer processing apparatus according to claim 1, wherein the second direction is parallel with the first direction.

10. The wafer processing apparatus according to claim 1, wherein the at least two protrusions are opposite each other across the central region of the second surface plate.

11. The wafer processing apparatus according to claim 1, wherein the body of each of the support members contacts one side surface of each of the at least two protrusions and is arranged in the same rotating direction with respect to each of the at least two protrusions.

12. The wafer processing apparatus according to claim 1, wherein a plurality of through holes is formed through the second surface plate such that density of the plurality of through holes arranged at the central region of the second surface plate is higher than density of the plurality of through holes arranged at the edge region of the second surface plate.

13. The wafer processing apparatus according to claim 1, further comprising a first pad arranged on the first surface plate between the first gear and the second gear.

14. The wafer processing apparatus according to claim 13, further comprising a second pad arranged on the second surface plate opposite the first pad, wherein the contour of a surface of the second pad opposite one surface of the first pad is reverse to the contour of the surface of the first pad.

15. A wafer processing apparatus comprising:
a first surface plate on which a plurality of carriers is arranged;
a first gear arranged at the central region of the first surface plate and engaged with the plurality of carriers;
a second gear arranged around the edge region of the first surface plate and engaged with the plurality of carriers;
a motor that rotates the first surface plate in a first direction;
a second surface plate arranged opposite the first surface plate and provided with a first pulley system arranged on the second surface plate;
a fixing hanger arranged opposite the first surface plate across the second surface plate and provided with a second pulley system arranged on the fixing hanger and guided by a cable together with the first pulley system;
a first pad arranged on the first surface plate between the first gear and the second gear; and
a second pad arranged on the second surface plate opposite the first pad, wherein the contour of a surface of the second pad opposite one surface of the first pad is reverse to the contour of the surface of the first pad.

16. The wafer processing apparatus according to claim 15, further comprising:

at least two protrusions arranged at a region of the second surface plate opposite the fixing hanger; and support members respectively coupled with the at least two protrusions and obstructing movement of the second surface plate in a second direction.

17. The wafer processing apparatus according to claim 16, wherein the second direction is parallel with the first direction.

18. The wafer processing apparatus according to claim 16, wherein the at least two protrusions are opposite each other across the central region of the second surface plate.

19. The wafer processing apparatus according to claim 16, wherein each of the support members includes a body that extends from the outer portion of the second surface plate, and at least one support combined with the body and surrounding each of the at least two protrusions.

20. The wafer processing apparatus according to claim 16, wherein the body of each of the support members contacts one side surface of each of the at least two protrusions and is arranged in the same rotating direction with respect to each of the at least two protrusions.

* * * * *